(12) United States Patent
Park et al.

(10) Patent No.: US 9,779,647 B2
(45) Date of Patent: Oct. 3, 2017

(54) DISPLAY DEVICE

(71) Applicant: Samsung Display Co., Ltd., Yongin (KR)

(72) Inventors: Chan Young Park, Yongin-si (KR); Jong Sung Bae, Hwaseong-si (KR); Dong Hyeon Lee, Seoul (KR); Jusuck Lee, Seoul (KR); Hee Soon Jeong, Hwaseong-si (KR); Seong Min Cho, Seongnam-si (KR); Eun Sil Han, Hwaseong-si (KR); Jeong Jin Hong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 90 days.

(21) Appl. No.: 14/623,452

(22) Filed: Feb. 16, 2015

(65) Prior Publication Data

US 2016/0071468 A1 Mar. 10, 2016

(30) Foreign Application Priority Data

Sep. 4, 2014 (KR) ........................ 10-2014-0117615

(51) Int. Cl.
*G09G 3/34* (2006.01)
*H01L 27/32* (2006.01)
*H01L 51/50* (2006.01)
*G09G 3/20* (2006.01)
(Continued)

(52) U.S. Cl.
CPC ......... *G09G 3/2003* (2013.01); *G09G 3/3233* (2013.01); *G09G 3/36* (2013.01); *G09G 3/3607* (2013.01); *G09G 2300/0443* (2013.01); *G09G 2300/0452* (2013.01); *G09G 2310/0235* (2013.01); *G09G 2320/0242* (2013.01);
(Continued)

(58) Field of Classification Search
CPC .. G09G 3/3413; G09G 3/2003; G09G 3/2074; G09G 2300/0452; G09G 2320/02; G09G 2330/021; G09G 2340/0457; G09G 2360/145; H01L 27/3213; H01L 51/504
See application file for complete search history.

(56) References Cited

U.S. PATENT DOCUMENTS

2005/0105796 A1* 5/2005 Hong .................... G06T 11/001
382/162
2007/0064422 A1* 3/2007 Murai .................. G09G 3/3413
362/231

(Continued)

FOREIGN PATENT DOCUMENTS

KR 10-2007-0099969 10/2007

*Primary Examiner* — Amare Mengistu
*Assistant Examiner* — Jennifer Zubajlo
(74) *Attorney, Agent, or Firm* — H.C. Park & Associates, PLC (57) ABSTRACT

A display device according to an exemplary embodiment of the present invention includes: a display panel including a plurality of pixels respectively displaying a first color, a second color, and a third color; and a signal controller controlling the display panel by processing an input image signal, wherein, in a color weakness mode, at least one color among the first to third colors is displayed with a higher gray than an input gray of the input image signal, and the other colors are displayed with the same gray as the input gray of the input image signal.

12 Claims, 7 Drawing Sheets

(51) Int. Cl.
*G09G 3/3233* (2016.01)
*G09G 3/36* (2006.01)
(52) U.S. Cl.
CPC .. *G09G 2320/0271* (2013.01); *H01L 27/3213* (2013.01); *H01L 51/504* (2013.01)

(56) References Cited

U.S. PATENT DOCUMENTS

| | | | |
|---|---|---|---|
| 2010/0039028 A1* | 2/2010 | Suzuki | H01L 27/322 |
| | | | 313/504 |
| 2010/0225252 A1* | 9/2010 | Weaver | H01L 27/3211 |
| | | | 315/312 |
| 2012/0223875 A1* | 9/2012 | Lau | H01L 27/156 |
| | | | 345/83 |
| 2013/0249955 A1 | 9/2013 | Kim et al. | |
| 2013/0335435 A1* | 12/2013 | Ambrus | G06T 19/20 |
| | | | 345/589 |
| 2014/0203244 A1* | 7/2014 | Hack | H01L 27/3213 |
| | | | 257/40 |

* cited by examiner

DISPLAY DEVICE

CROSS-REFERENCE TO RELATED APPLICATION

This application claims priority from and the benefit of Korean Patent Application No. 10-2014-0117615, filed on Sep. 4, 2014, which is hereby incorporated by reference for all purposes as if fully set forth herein.

BACKGROUND

Field

Exemplary embodiments relate to a display device.

Discussion of the Background

Humans perceive color through sensing of photoreceptors stimulated by light acceptance. Although there are individual differences in a color sense as a sense perceiving the color by the wavelength difference of the light, most people can distinguish colors normally. However, some people can not normally distinguish colors due to a congenital dysfunction of retina cone cells, an acquired damage thereof, or a path error of the vision sense. This is referred to as a dyschromatopsia, and is divided into color blind and color weakness according to the degree thereof.

The color perceived by normally sighted persons is represented by a mixture of three kinds of a monochromatic light, that is, red, green, and blue. The color weakness is a case that functions of one or more of three types of cone cells such as L (Red), M (Green), and S (Blue) are incomplete, and color vision defectives do not properly distinguish between colors that are easily distinguishable by the normal persons. The most common color weakness is a case that the L cone cell governing red or the M cone cell governing green are non-functional, and in the spectral region, there is a state that properties of cone cell curves are away from the normal position. Since a representation of a position deviates from the characteristic cone cell curves, the color vision defectives also do not correctly recognize the color expressed by the image displayed in the display device or the unique color of the object.

The above information disclosed in this background section is only for enhancement of understanding of the background of the inventive concept, and, therefore, it may contain information that does not form the prior art that is already known in this country to a person of ordinary skill in the art.

SUMMARY

Exemplary embodiments provide a display device expressing an image so that color vision defectives can correctly distinguish a color.

Additional aspects will be set forth in the detailed description which follows, and, in part, will be apparent from the disclosure, or may be learned by practice of the inventive concept.

A display device according to an exemplary embodiment of the present invention includes: a display panel including a plurality of pixels respectively displaying a first color, a second color, and a third color; and a signal controller is configured to control the display panel by processing an input image signal, wherein, in a color weakness mode, at least one color among the first to third colors is displayed with a higher gray than an input gray of the input image signal, and the other colors are displayed with the same gray as the input gray of the input image signal.

The color weakness mode may include a plurality of lower modes according to the kinds of an emphasized color, and the lower modes may include a protanomaly mode emphasizing red, a deuteranomaly mode emphasizing green, and a tritanomaly mode emphasizing blue.

In a normal mode, the first to third colors may be displayed with the same gray as the input gray of the input image signal.

The signal controller may include an image convertor converting the input image signal to generate a compensation image signal.

The conversion of the input image signal may generate the compensation image signal by increasing the gray of the predetermined color so as to increase the luminance of the predetermined color related to the color weakness among the input image signals.

The compensation image signal is stored to a storage unit as an image conversion setting value.

The signal controller may further include an image input section receiving the input image signal, and an image processor generating image data based on the input image signal or the compensation image signal.

The image processor may receive the input image signal from the image input section in the normal mode to generate the image data, and receive the compensation image signal from the image convertor in the color weakness mode to generate the image data.

The first to third colors may be sequentially displayed by time division.

In the color weakness mode, during one frame, at least one color displayed with the higher gray than the input gray may be displayed longer than the other colors.

In the color weakness mode, during one frame, the pixels displaying the other colors may be applied with higher data voltages than the data voltages corresponding to the input gray.

In the color weakness mode, during one frame, the first to third colors may be equally time-divided and sequentially displayed, and the pixel displaying at least one color displayed with the higher gray than the input gray may be applied with a higher data voltage than the data voltage corresponding to the input gray.

The display device may further include a mode selector to select the normal mode or the color weakness mode.

The display device may include a light-emitting element as an organic light emitting diode.

A display device according to another exemplary embodiment of the present invention includes a display panel including a plurality of unit pixels, wherein each unit pixel includes a first color pixel, a second color pixel, and a third color pixel. The unit pixel may further include an additional pixel displaying the same-based color as the color displayed by any one pixel of the first color pixel, the second color pixel, and the third color pixel.

The color displayed by the additional pixel may have a spectrum of the same wavelength as or different from the color displayed by the any one pixel.

The additional pixel may be included in some unit pixels, and the unit pixels including the additional pixel may be uniformly distributed on the entire display panel.

A display device according to another exemplary embodiment of the present invention includes an emission layer in which a first color emission layer, a second color emission layer, and a third color emission layer are stacked between an anode and a cathode. The emission layer may further include an additional emission layer emitting the same-based color as a color emitted by any one emission layer among the first color emission layer, second color emission layer, and third color emission layer.

The color emitted by the additional emission layer may have a spectrum of a different wavelength from the color emitted by the any one emission layer.

The display device may further include a first color filter, a second color filter, and a third color filter on the cathode.

The two emission layers emitting the same-based color are positioned to contact each other.

The display device according to an exemplary embodiment of the present invention enhances and displays the color that is easily not recognized by the color vision defectives, so that the color vision defectives may correctly recognize or distinguish the color. Also, it is not necessary to deteriorate the luminance of the other colors to enhance the predetermined color, so that the entire luminance of the display device is not deteriorated.

The display device according to an exemplary embodiment of the present invention may display the normal image to be suitable for the normal person and the compensation image to be suitable for the color vision defectives, and may easily switch the normal mode for the normal person and the color weakness mode for the color vision defectives through the mode conversion switch.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Now, a display device according to an exemplary embodiment of the present invention will be described with reference to accompanying drawings. Although an organic light emitting display device will be mainly described, the present invention may be applied to other display devices, such as a liquid crystal display, a plasma display device, and an electrophoretic display.

Figure 1:
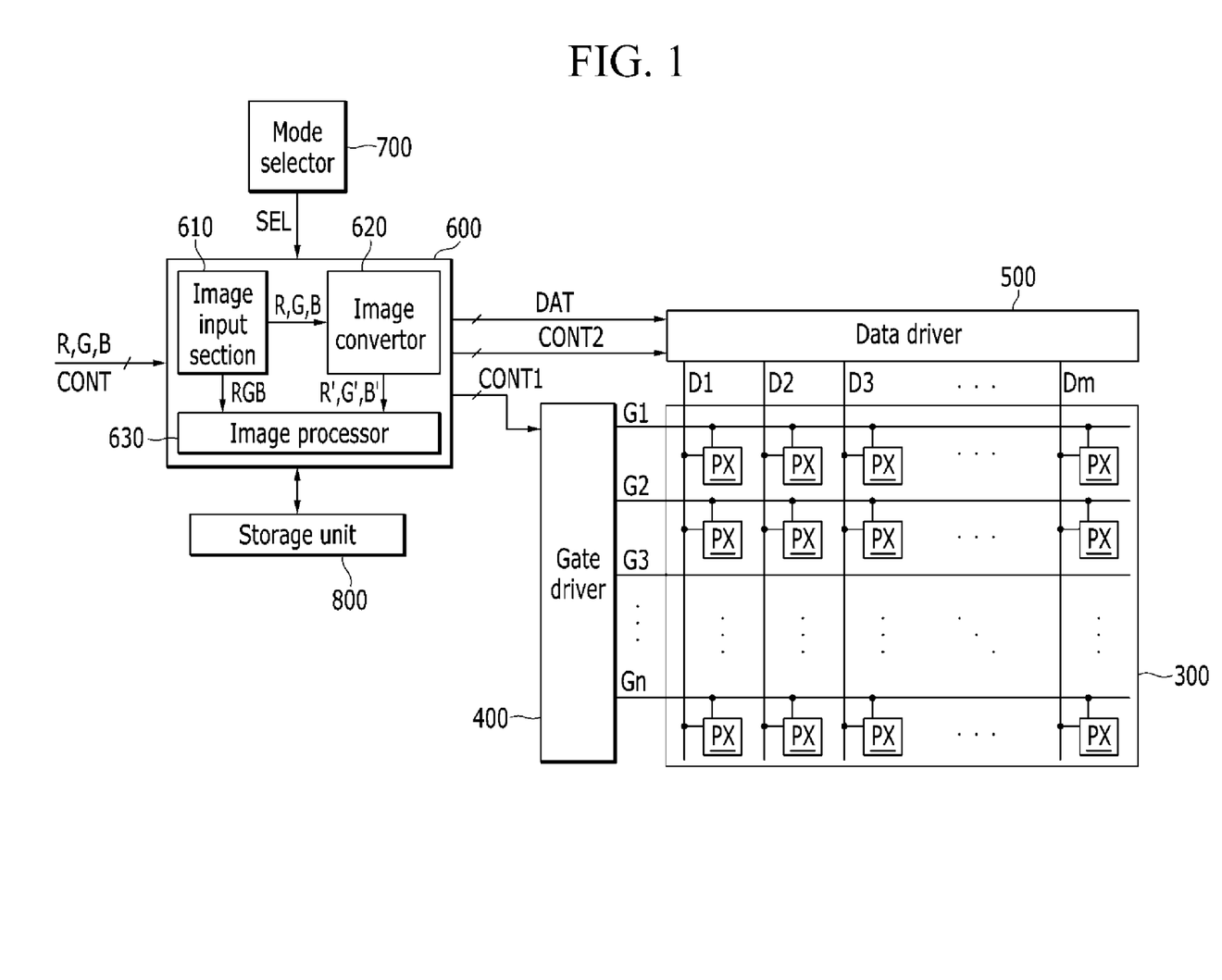
FIG. 1 is a layout view of a display device according to an exemplary embodiment of the present invention.

FIG. 1 is a layout view of a display device according to an exemplary embodiment of the present invention.

Referring to FIG. 1, the display device includes a display panel 300, a gate driver 400 and a data driver 500 connected thereto, and a signal controller 600 controlling the gate driver 400 and the data driver 500. The display device may further include a mode selector 700. The display device may operate in a normal mode to display a normal image according to an input image signal, or may operate in a color weakness mode to display a color compensation image in which a predetermined color is enhanced.

The display panel 300 includes a plurality of gate lines G1-Gn and a plurality of data lines D1-Dm, and a plurality of pixels PX connected thereto and arranged with a matrix shape. The pixels include pixels respectively expressing three primary colors of light such as red, green, and blue. The pixel including each of the three colored pixels is referred to as a unit pixel. The unit pixel may further include a pixel expressing white.

The gate driver 400 is connected to the gate lines G1 through Gn of the display panel 300 and applies a gate-on voltage to the gate lines G1 through Gn.

The data driver 500 is connected to the data lines D1 through Dm of the display panel 300 and applies data voltages corresponding to input image signals R, G, and B to the data lines D1 through Dm. The data driver 500 converts the image data DAT into the data voltage by using the gray voltages generated from a gray voltage generator (not shown).

The signal controller 600 receives the image signals R, G, and B and a control signal CONT thereof to control the gate driver 400 and the data driver 500, thereby controls the display panel 300. The control signal CONT includes a horizontal synchronizing signal Hsync, a vertical synchronization signal Vsync, a clock signal CLK, and a data enable signal DE. The signal controller 600 generates and outputs the gate control signal CONT1, the data control signal CONT2, and the clock signal.

The signal controller 600 may include an image input section 610, an image convertor 620, and an image processor 630, and at least one of them may be separately configured outside the signal controller 600.

The image input section 610 receives the input image signal R, G, and B and the control signal CONT thereof from the outside or a graphics chip. When the display device operates in the color weakness mode, the received input image signals R, G, and B are sent to the image convertor 620 and then sent to the image processor 630. When the display device operates in the normal mode, they are sent to the image processor 630 without going through the image convertor 620.

The image convertor 620 converts the input image signals R, G, and B according to the kind of the color weakness or the degree of the color weakness to generate and transmit a compensation image signals R', G', and B' to the image processor 630. The conversion of the image signal generates the compensation image signals R', G', and B' by increasing the gray of the predetermined color so as to increase the luminance of the predetermined color related to the color weakness among the input image signals R, G, and B.

The image processor 630 receives the input image signals R, G, and B from the image input section 610 in the case of the normal mode and the compensation image signals R', G', and B' from the image convertor 620 in the case of the color weakness mode. The image processor 630 processes the transmitted input image signals R, G, and B or compensation image signals R', G', and B' to be suitable for the operating conditions of the display panel 300 according to the control signal CONT to generate and output the image data DAT.

On the other hand, the compensation image signals R', G', and B' generated by the image convertor 620 may be stored to a storage unit 800 as an image conversion setting value. At this time, the image conversion setting value is directly loaded in the switching of the normal mode and the color weakness mode, so that the mode switching may be quickly performed. The image conversion setting value may be stored as a lookup table type. The storage unit 800 may store various data related to the operation of the signal controller 600, and may include a non-volatile memory such as an EEPROM (electrically erasable and programmable read only memory).

The mode selector 700 transmits to the signal controller 600 a selection signal SEL to determine which mode the display device operates in, among the normal mode, the color weakness mode and combinations thereof. The mode selector 700 may be provided as a predetermined menu in a product, for example, a monitor, a television, and a mobile phone so that the viewer may easily access it, as a physical switch of the product or as an additional device such as a remote controller.

Here, the normal mode is the mode displaying the image by processing the input image signal with a general method to be suitable for the operating conditions of the display panel through the display device. The color weakness mode processes the input image signal to be suitable for the operating conditions of the display panel. It means that this displaying mode emphasizes the image in which the color that is not correctly recognized by the color vision defectives. That is, the color weakness mode may be regarded as the mode displaying the image compensated with the color so as to increase the color recognition of the color vision defectives. Generally, emphasizing and displaying the predetermined color means to increase the luminance of the color. However, it may also include displaying the color of the wavelength region that may be easily recognized by the color vision defectives for the predetermined color.

The color weakness mode includes several lower modes depending on what kind of color is emphasized. For example, the lower mode may include a protanomaly mode emphasizing red R, a deuteranomaly mode emphasizing green G, and a tritanomaly mode emphasizing blue B. Also, in the predetermined color weakness mode, other colors may be emphasized to be displayed as well as the predetermined color. For example, in the protanomaly mode, green G may be emphasized along with red R. Also, the predetermined color weakness mode may further include an additional lower mode according to the degree of the color weakness. The color weakness mode and the lower mode may be selected by the user, or may be selected by the display device by adding an algorithm related to a color weakness confirm mode that will be described later to the display device.

A normal person without the color weakness recognizes the normal color in the normal mode. However, color-distorted-images in which the color is distorted, for example, the image in which the predetermined color is emphasized compared to the actual color to be displayed, can be shown in the color weakness mode. In contrast, the color vision defectives may not distinguish the color in the image displayed in the normal mode, however the color vision defectives may distinguish the color in the image displayed in the color weakness mode or may recognize the almost correct color.

According to the exemplary embodiment, the mode selector 700 may include the color weakness confirm mode.

Figure 2:
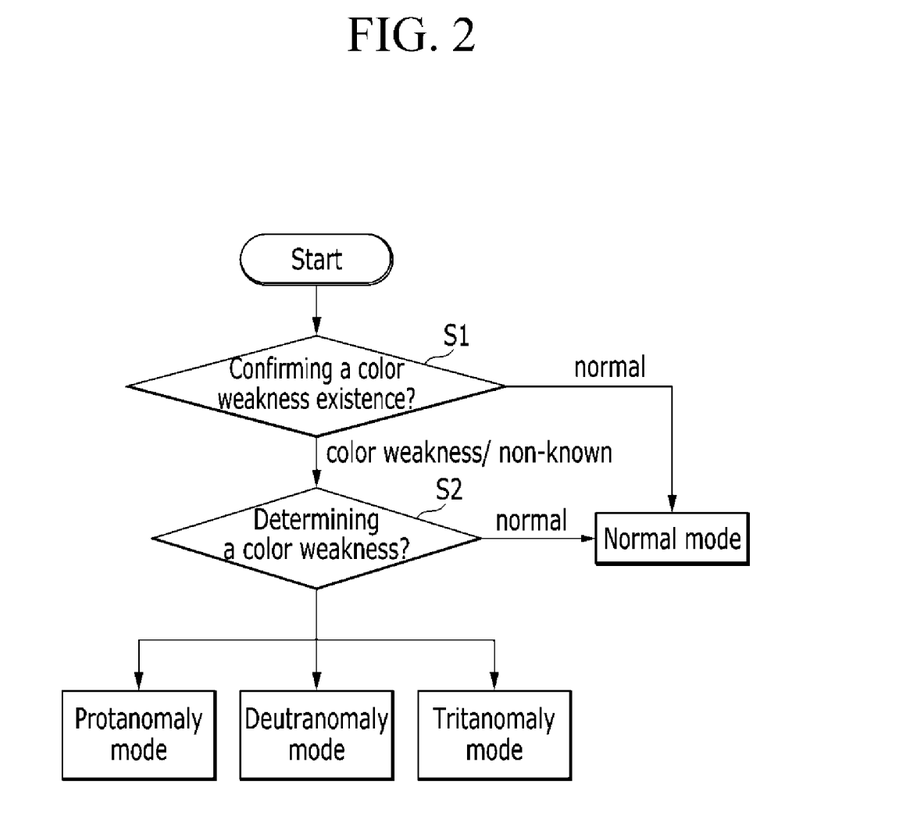
FIG. 2 is a flowchart for a color weakness confirm mode.

FIG. 2 is a flowchart for the color weakness confirm mode.

Referring to FIG. 2, the color weakness confirm mode includes a step S1 of confirming the color weakness existence and a step S2 of determining the color weakness. In the step S1 of confirming the color weakness existence, the display device may display the image asking about the color weakness existence of the user. The user may response through an input means (e.g., a remote controller) provided in the display device or separately provided. For example, when the user responds that there is no color weakness, the display device operates in the normal mode, and when there is a color weakness or there is a response that the color weakness existence is not known, the step S2 of determining the color weakness is performed. In the step S2 of determining the color weakness, the display device displays a test image to confirm the kind of color weakness and the degree of the color weakness. Also, the display device confirms the color weakness based on the reaction of the user through the input means, and when it is confirmed that there is no color weakness, the display device is operated with the normal mode, while when it is confirmed that there is a color weakness, the display device may be operated in the color weakness mode (particularly, the protanomaly mode, the deuteranomaly mode, and the tritanomaly mode as the lower mode according to the predetermined color weakness). The step S1 of confirming the color weakness may be omitted.

As described above, the input image signals R, G, and B are directly transmitted from the image input section 610 to the image processor 630 in the normal mode, and are compensated in the image convertor 620 and then transmitted to the image processor 630 in the color weakness mode. For the confirmation related to the color weakness, a Farnsworth-Munsell color test or a D-15 color arrangement test may be used. The algorithm and the test image information may be stored to the storage unit 800 for the color weakness confirm mode.

When the display device is an organic light emitting display device, it may further include a light emission signal unit (not shown). The light emission signal unit may be connected to each pixel of the display panel 300 through a light emission signal line (not shown). The light emission signal unit may generate a light emission signal according to a light emission control signal input from the signal controller 600, and thereby the light emission signal unit applies the light emission signal controlling a light emission time of a light-emitting element as an organic light emitting diode to the light emission signal line.

Figure 3:
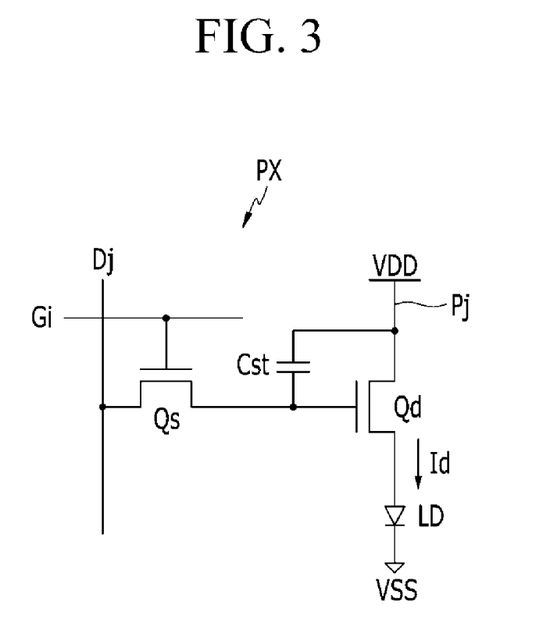
FIG. 3 is an exemplary circuit diagram of one pixel in the display device of FIG.

FIG. 3 is an exemplary circuit diagram of one pixel in the display device of FIG.

Referring to FIG. 3, one pixel PX is connected to a gate signal line Gi transmitting a gate-on voltage and a data line Di transmitting a data voltage. In the case of the organic light emitting device, a power line Pj transmitting a driving voltage VDD may also be connected.

The pixel PX of the organic light emitting device basically includes a switching transistor Qs, a driving transistor Qd, a storage capacitor Cst, and a light-emitting element LD. Although not shown in the drawing, one pixel PX may further include an additional thin film transistor to configure a circuit to compensate a threshold voltage of the driving transistor Qd, and may further include a capacitor. The compensation circuit including the additional element may be implemented in various ways, but in this case, a base pixel circuit shown in FIG. 3 will be mainly described.

The switching transistor Qs includes a control terminal connected to a gate signal line Gi, an input terminal connected to the data line Dj, and an output terminal connected to a driving transistor Qd. The switching transistor Qs is turned on if the control terminal is applied with the gate-on voltage, and the data voltage applied to the data line Dj is transmitted to the driving transistor Qd through the switching transistor Qs.

The driving transistor Qd includes the control terminal connected to the switching transistor Qs, the input terminal connected to the power line Pj, and the output terminal connected to the light-emitting element LD. A current amount flowing to the driving transistor Qd is controlled between a voltage between the control terminal and the output terminal of the driving transistor Qd.

The storage capacitor Cst is connected between the control terminal and the input terminal of the driving transistor Qd. The storage capacitor Cst stores the data signal applied to the control terminal of the driving transistor Qd and maintains the data signal after the switching transistor Qs turns off, thereby continuously emitting the light-emitting element LD until the next data voltage is applied.

The light-emitting element LD has an anode connected to the output terminal of the driving transistor Qd and a cathode connected to a ground voltage or a common voltage. The light-emitting element LD emits light by changing intensity according to an output current of the driving transistor Qd, thereby displaying the image.

On the other hand, when the display device includes the light emission signal unit and the light emission signal line, the pixel for example may include a light emission transistor (not shown) between the driving transistor Qd and the light-emitting element LD. In this case, the light emission transistor may include the input terminal connected to the output terminal of the driving transistor Qd, the output terminal connected to the anode of the light-emitting element LD, and the control terminal connected to the light emission signal line. The light emission transistor may control a driving current flowing to the light-emitting element LD from the driving transistor Qd according to the light emission signal applied through the light emission signal line, thereby controlling the light emission time of the light-emitting element LD.

Hereafter, an exemplary embodiment for displaying the image according to the mode in the display device will be described in detail.

Figure 4:
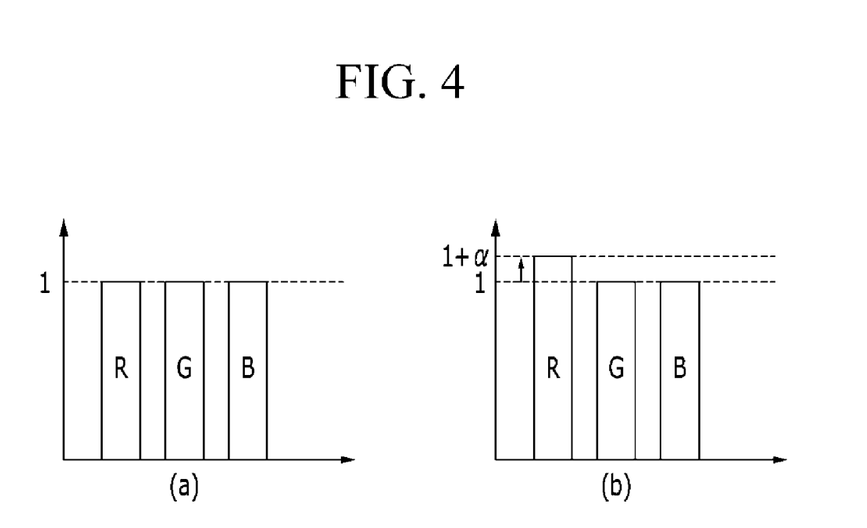
FIG. 4 is a view showing a luminance distribution for each pixel in a normal mode and a color weakness mode in a display device according to an exemplary embodiment of the present invention.

FIG. 4 is a view showing a luminance distribution for each pixel in a normal mode and a color weakness mode in a display device according to an exemplary embodiment of the present invention.

In FIG. 4, a left drawing (a) shows a luminance distribution in the normal mode and a right drawing (b) shows the luminance distribution in the color weakness mode.

If the input image signals R, G, and B are input to the display device including the red pixel, the green pixel, and the blue pixel, each pixel of the display device displays the luminance according to luminance information (referred to as an input gray) included in the input image signals R, G, and B. Referring to the left drawing (a), when the display device operates in the normal mode, the red pixel, the green pixel, and the blue pixel are equally distributed with the luminance rate of 1:1:1. Here, the number "1" means that the same gray as the input gray of the input image signals R, G, and B is displayed. Since the red pixel, the green pixel, and the blue pixel of the display device respectively display their color with the luminance according to the luminance information of the input image signals R, G, and B, the person with the normal color sense sees the image displayed with the color according to the input image signal.

When the display device operates in the color weakness mode, the pixel displaying the color that is not easily recognized by the color vision defectives among the red pixel, the green pixel, and the blue pixel displays its color with the higher gray level than the gray level of the input image signals R, G, and B. For example, in the color weakness mode of the red color, referring to the right drawing (b), the luminance of $(1+\alpha):1:1$ is distributed to the red pixel, the green pixel, and the blue pixel (here, $\alpha>0$). In other words, the green pixel and the blue pixel respectively display green and blue with the same gray levels as the gray levels of the input image signal G and B, however the red pixel displays red with the higher gray level (the gray that is increased by $\alpha$) than the gray level of the input image signal R. For example, when displaying white appropriate for the red color impairment, the green pixel and the blue pixel represent a predetermined maximum luminance in the normal mode of the display device and the red pixel may represent the higher luminance than the maximum luminance. For this, the image convertor 620 may perform the signal processing (the color compensation) expressed by the following equation, for example in the protanomaly mode.

$$\begin{bmatrix} R \\ G \\ B \end{bmatrix}_{Input} \rightarrow \begin{bmatrix} R+\alpha R \\ G \\ B \end{bmatrix}_{\substack{Color \\ Compensation}} \rightarrow \begin{bmatrix} R' \\ G \\ B \end{bmatrix}_{Output}$$

When the display device is the organic light emitting device, the higher data voltage is applied to the red pixel to increase the current flowing to the light-emitting element, to increase the luminance of the red pixel without the luminance deterioration of the green pixel and the blue pixel. The red-color vision defectives have lower distinguishability of red and recognizes red more darkly compared with the normal person. Accordingly, when the luminance of the red pixel is relatively increased, a red recognition ability of the red-color vision defectives are improved, so that the color distinguishability may be improved, the color feeling when the normal person sees the normal image may be felt in the image displayed with the color weakness mode.

In the above, the protanomaly mode for the red-color vision defectives are described, however the color weakness mode may include the mode appropriate for the predetermined color vision defectives such as the deuteranomaly mode and the tritanomaly mode. In the deuteranomaly mode, the red pixel, the green pixel, and the blue pixel are distributed with the luminance of $1:(1+\beta):1$. In the tritanomaly mode, the red pixel, the green pixel, and the blue pixel are distributed with the luminance of $1:1:(1+\gamma)$ (here, $\beta>0$ and $\gamma>0$). The luminance distribution displays the higher luminance of the predetermined color to be enhanced than the luminance information of the input image signal, and displays the luminance of the other colors according to the luminance information of the input image signal. Accordingly, although the image is displayed in the color weakness mode, the predetermined color may be enhanced and displayed without deterioration of the entire luminance of the displayed image.

$\alpha$, $\beta$, and/or $\gamma$ meaning the gray increasing rate for the enhancement of the predetermined color may be a fixed value, or may be a variation value having a range that may be selected to be appropriate for the degree of the color weakness of the color vision defectives. In the latter case, the display device may be designed to change $\alpha$, $\beta$, and/or $\gamma$, in other words, to select the enhancement degree of the predetermined color.

Figure 5:
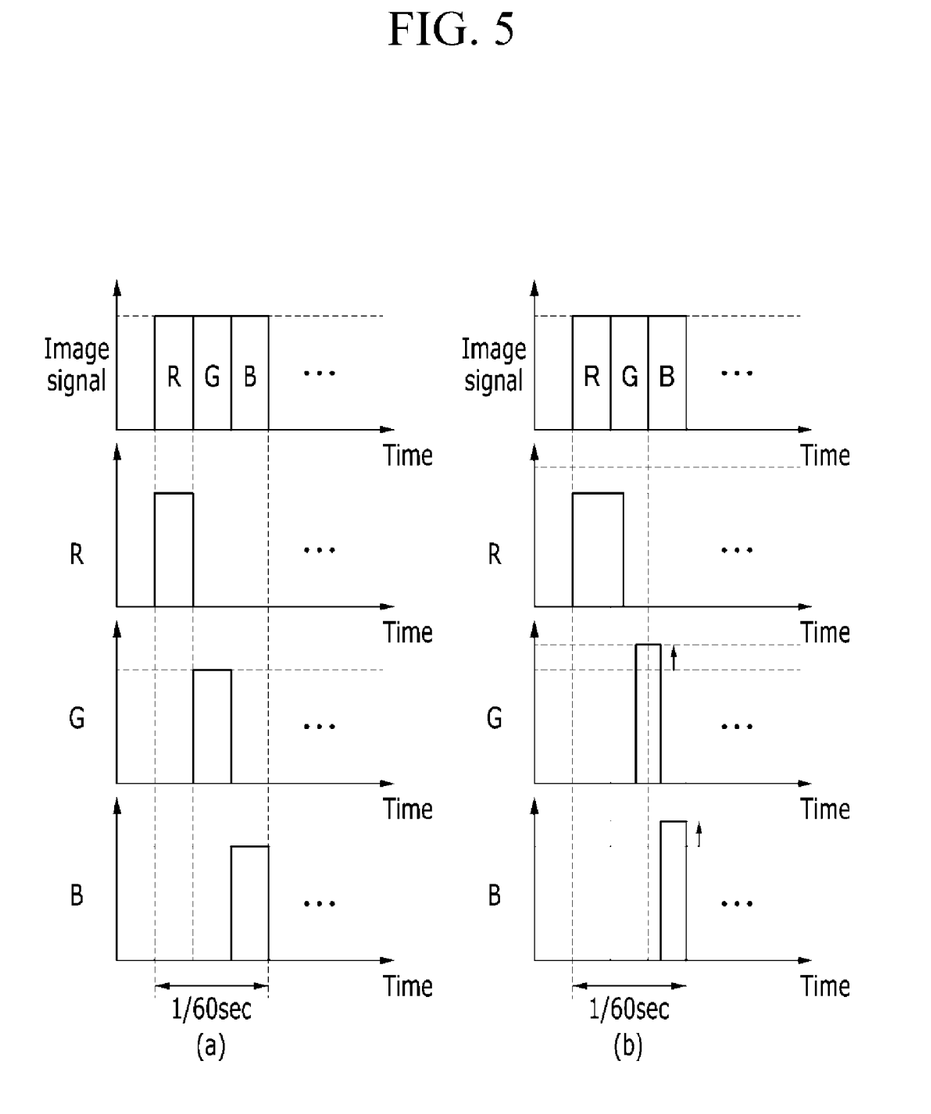
FIG. 5 and FIG. 6 are views showing a normal mode and a color weakness mode according to a time division method in a display device according to an exemplary embodiment of the present invention.
Figure 6:
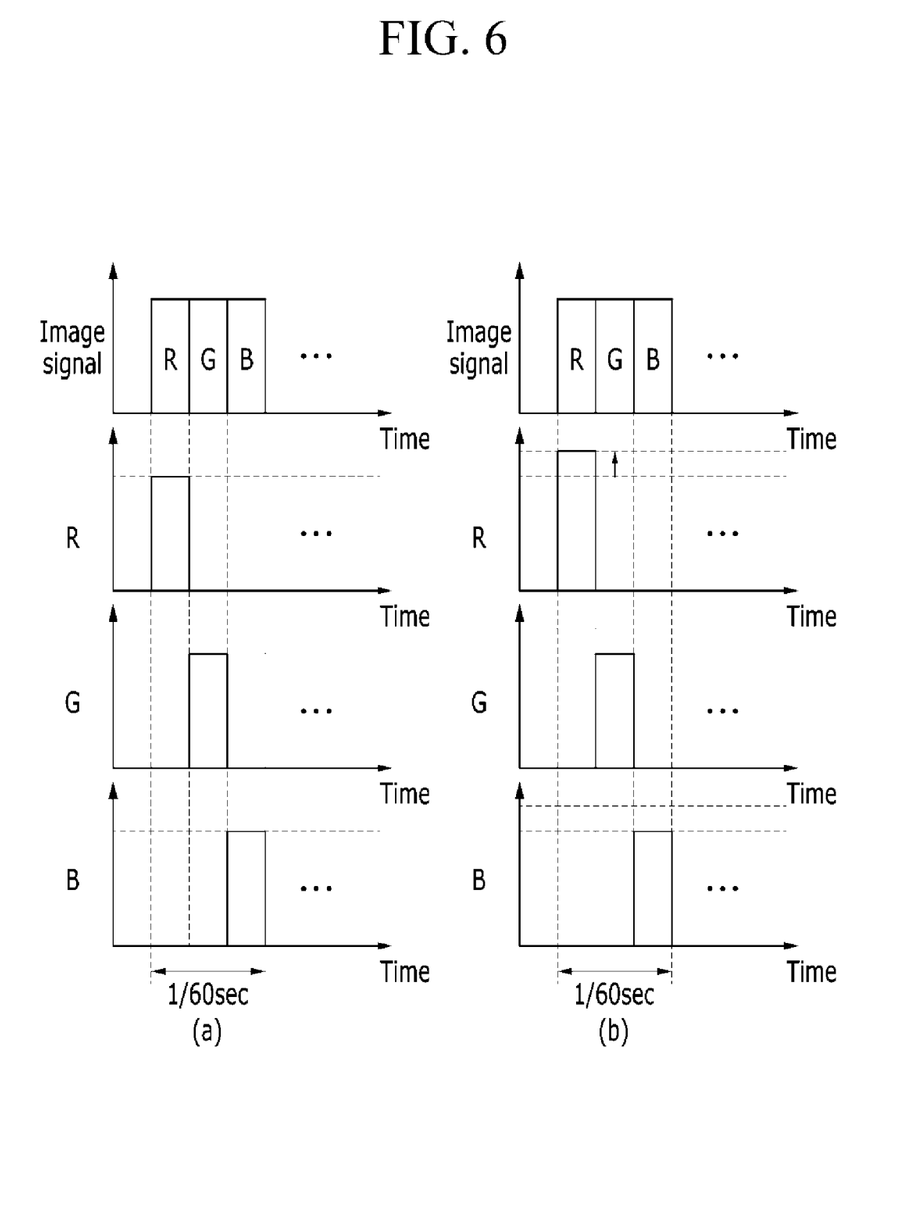

FIG. 5 and FIG. 6 are views showing a normal mode and a color weakness mode according to a time division method in a display device according to an exemplary embodiment of the present invention.

The exemplary embodiment of FIG. 5 and FIG. 6 includes a time division concept, differently from the exemplary embodiment of FIG. 4, and increases recognition in a different method.

First, referring to a left drawing (a) of FIG. 5, in the normal mode for the viewing of the normal person, the display device is driven by equally time-dividing the input image signals R, G, and B during one frame to be sequentially displayed for each color. For example, in the display device in which one frame is operated for $\frac{1}{60}$ of a second, the display device may be displayed to display red R during the first $\frac{1}{180}$ of a second of one frame, green G during the next $\frac{1}{180}$ of a second, and blue B during the final $\frac{1}{180}$ of a second. Thus, since red R, green G, and blue B are displayed through the same time, the display device displays each color with the luminance according to the input image signals R, G, and B, so that the normal person may see the image expressing the normal color. Here, to sequentially display each color means not to substantially overlap the display time of each color, however the display sequence on the color is not limited to as shown. For example, green G, red R, and blue B may be sequentially displayed, and blue B, green G, and red R may be sequentially displayed.

The right drawing (b) of FIG. 5 describes an example in which the display device is driven in the color weakness mode. By increasing the driving time of the predetermined color and reducing the driving time of other colors during one frame, the luminance of the predetermined color may be increased. For example, when increasing the intensity of red R, if the driving time of the red R pixel is increased, the time of emitting the red light in the red (R) pixel during the predetermined time (one frame) is increased, so that the luminance of the red pixel is increased.

When sequentially displaying red R, green G, and blue B during the determined time, if the time of displaying red R is increased, the time of displaying the other colors G and B must be reduced. That is, when one frame is $\frac{1}{60}$ of a second, if the display time of red R is increased to as much as $\frac{1}{180}$ of a second which is $\frac{1}{3}$ of $\frac{1}{60}$ of a second, the time for displaying green G and blue B respectively is decreased by $\frac{1}{2}$ of the increased amount of the display time of red R. In this case, the time of displaying green G and blue B is shorter than the displayed time in the normal mode, so that the luminance of green G and blue B is reduced. Accordingly, by increasing the display intensity of green G and blue B corresponding to the shortened display time of green G and blue B (i.e., to compensate the luminance deterioration by the shortened display time), the luminance of these color may be substantially maintained like the display of the normal mode. Increasing the display intensity may be performed by applying a higher data voltage than that corresponding to the input gray of the input image signal to the pixel, for example, to increase the current flowing to the light-emitting element LD.

On the other hand, the display device may be driven to increase the display intensity of red R in addition to increasing the display time of red R. This is advantageous for the color vision defectives having the serious color weakness.

In the case of the organic light emitting display device, controlling the driving time for each color may be performed for example by differentiating the characteristics (e.g., the width of the low level) of the light emission signal applied through the light emission signal line connected to each pixel for each color to differently control the light emission time of the light-emitting element.

In the case of the deuteranomaly mode or the tritanomaly mode, like the previously described protanomaly mode, the display time of green or blue is increased and the display time of the other colors is reduced, but the intensity thereof is increased, thereby increasing the luminance of the color to be enhanced without the deterioration of the entire luminance.

The left drawing (a) of FIG. 6 is the same as the left drawing (a) of FIG. 5, and accordingly the driving in the normal mode for the viewing of the normal person is shown. The right drawing (b) of FIG. 6 shows an exemplary embodiment of increasing the display intensity of the color to be enhanced while sequentially displaying each color of the unit pixel among the color weakness mode. That is, the color weakness mode according to this exemplary embodiment has an equal display time for each color like the normal mode and only the display intensity of the color that is not easily recognized by the color vision defectives is increased, thereby increasing the luminance of that color. The display intensity is increased by applying the higher data voltage than the data voltage corresponding to the gray level of the input image signal to the pixel to increase the current flowing to the light-emitting element LD.

In the above, the color weakness mode is driven by changing the driving characteristics in the general display device in which the unit pixel includes the red, green, and blue pixels. Hereafter, an example for realizing the display device appropriate for the color vision defectives by changing the structure or the arrangement of the pixel will be described.

Figure 7:
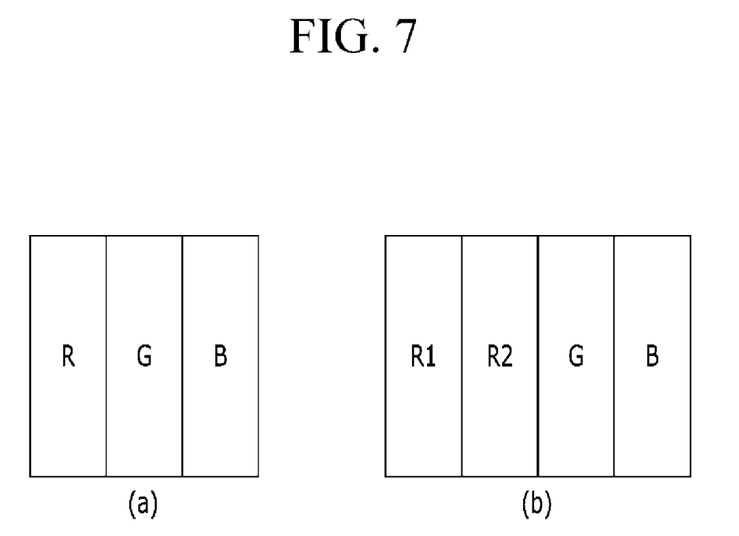
FIG. 7 and FIG. 8 are views of a pixel arrangement of a display device according to an exemplary embodiment of the present invention.
Figure 8:
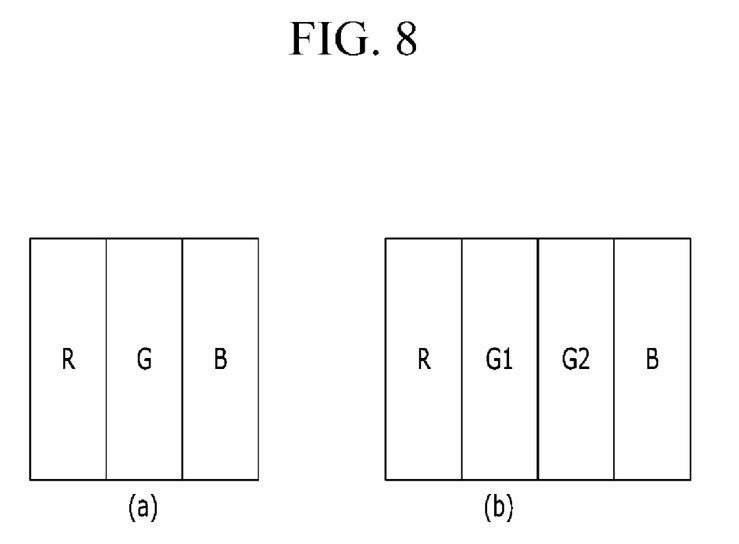

FIG. 7 and FIG. 8 are views of a pixel arrangement of a display device according to an exemplary embodiment of the present invention.

First, the drawings (a) of FIG. 7 and FIG. 8 show an example of the pixel arrangement of the general display device including the unit pixel made of the red pixel, the green pixel, and the blue pixel. The display device has a pixel arrangement in which the unit pixel as a group of pixels respectively displaying the primary colors such as red R, green G, and blue B are arranged on the entire display panel. The arrangement sequence, position, size, and aspect ratlike that of the colored pixel in the unit pixel may be various. The plurality of colors may be expressed by combining the pixels respectively displaying three colors.

The right drawing (b) of FIG. 7 shows an example of the pixel arrangement in which the basic pixel further includes a pixel expressing a color R2 to be enhanced as well as the general red R1, green G, and blue B pixels. For example, when the display device is designed to display the image for the red-color vision defectives, the basic pixel includes the pixel displaying the additional red R2. Accordingly, the unit pixel includes the green pixel and the blue pixel individually, but two red pixels are included, thereby enhancing red to display the image. The red R2 pixel may be included in all unit pixels, or may only be included in some unit pixels. In the latter case, the unit pixel including the red R2 pixel may be designed to be uniformly distributed on the entire display panel. The red R2 pixel may be positioned to be adjacent to the red R1 pixel or to be interposed with the other color pixels.

The red R1 and the red R2 may have a spectrum of the same wavelength region, or may include the entire red wavelength region (i.e., displaying the red-based color), but may have a spectrum of a different wavelength region (i.e., a peak wavelength is different). In the former case, the red of the same wavelength region is displayed twice, so that the red is enhanced, thereby the red-color vision defectives well distinguishes the color or may further recognize the red. In the latter case, at least one of the red R1 and the red R2 may have the spectrum of the red wavelength region that may be easily recognized to the red-color vision defectives. For example, the red R1 may have the spectrum of the peak of about 560 nm, and the red R2 may have the red-based spectrum having a peak in the lower wavelength most-sensitively reacted to by the red-color vision defectives. The red having the higher sensitivity is displayed to the red-color vision defectives, so that the red-color vision defectives may easily recognize the red or may distinguish the color.

In the display device according to the above exemplary embodiment, when displaying the image, the red-color vision defectives have improved red recognition ability and color distinguishability; however the normal person sees the image in which the red is exaggerated. Accordingly, when displaying the general color image to the normal person, the display device may be designed for the red displayed by the red R1 and the red R2 pixel to correspond to the input image signal so that the image signal input to the red R1 pixel and the red R2 pixel may be changed and displayed. As an example of this method, the signal processing may be performed to decrease the luminance of one or all of the red R1 pixel and the red R2 pixel.

The exemplary embodiment of FIG. 8 is similar to the exemplary embodiment of FIG. 7, however it is a pixel arrangement suitable for the deuteranomaly mode. The unit pixel further includes the pixel representing a green G2 to be enhanced as well as the red R, the green G1, and the blue B pixels. Like the exemplary embodiment of FIG. 7, the green G2 pixel may be included in all unit pixels or some unit pixels. Also, the green G1 and the green G2 may have the spectrum of the normal wavelength region, or the spectrum of different wavelength regions. Further, all characteristics described in the exemplary embodiment of FIG. 5 related to the enhanced color may be applied to the present exemplary embodiment. As another exemplary embodiment, in the display device for the blue-color vision defectives, the unit pixel may further include the blue B2 pixel as well as the red R, the green G, and the blue B1 pixels, and all characteristics described in the exemplary embodiment of FIG. 7 may be applied to the present exemplary embodiment.

Figure 9:
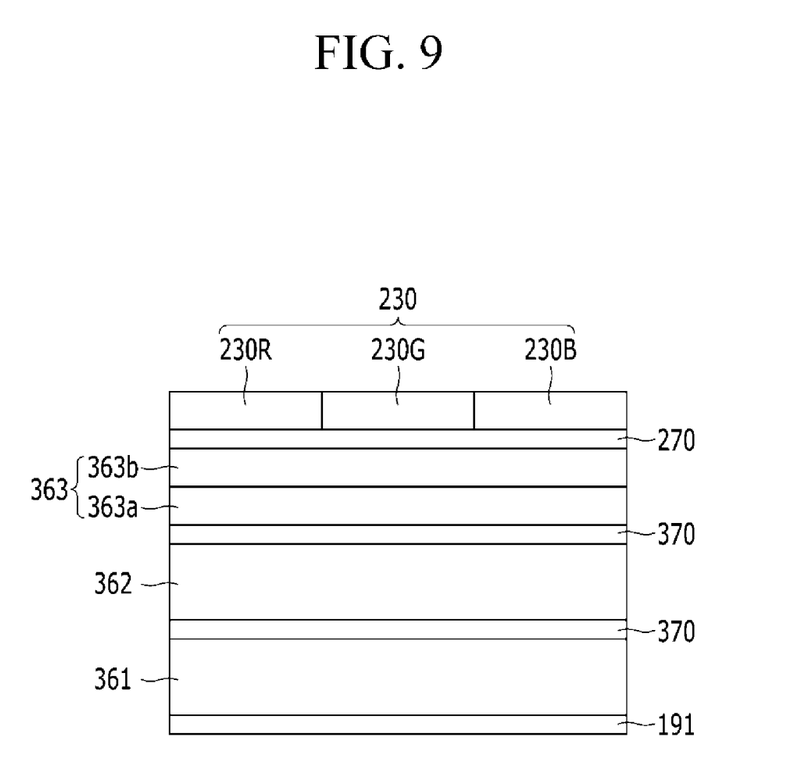
FIG. 9 is a view showing a stack structure of an emission layer of a pixel in a display device according to an exemplary embodiment of the present invention.

FIG. 9 is a view showing a stack structure of an emission layer of a pixel in a display device according to an exemplary embodiment of the present invention.

An emission layer of the organic light emitting element, for example, has a stack structure in which a blue emission layer 361, a green emission layer 362, and a red emission layer 363 are stacked. In the stack structure, an anode 191 is positioned under the blue emission layer 361, and a cathode 270 is positioned on the red emission layer 363. A charge generation layer 370 may be positioned between the blue emission layer 361 and the green emission layer 362 and between the green emission layer 362 and the red emission layer 363. A color filter 230 is positioned on the cathode 270 or under the anode 191, and the color filter 230 includes a red filter 230R defining the red pixel, a green filter 230G defining the green pixel, and a blue filter 230B defining the blue pixel. White light as a mixture light generated in the emission layer of the blue, green, and red stack structure represents the color (i.e., red, green, or blue) of each pixel through the color filter 230.

Although not shown, a hole injection layer and a hole transfer layer may be positioned between the anode 191 and the blue emission layer 361. The hole injection layer and the hole transfer layer easily pass the hole from the anode 191 to the emission layer, and may be formed as a divided layer or as one layer. An electron transfer layer to easily inject the electron from the cathode to the emission layer may be positioned between the cathode 270 and the red emission layer 363. An electron injection layer may be further positioned between the electron transfer layer and the cathode 270, and the electron injection layer further easily injects the electron from the cathode 270 to the emission layer.

To enhance the predetermined color that is difficult to be recognized by the color vision defectives, the emission layer of the stack structure further includes the emission layer emitting the color to be enhanced. For example, when enhancing the red, the red emission layer 363 may include two emission layers of a first red emission layer 363a and a second red emission layer 363b. The first red emission layer 363a and the second red emission layer 363b may have different spectrums or the same spectrum. One or both of the first red emission layer 363a and the second red emission layer 363b may provide the wavelength spectrum having the high sensitivity to the red-color vision defectives. Two emission layers emitting the color to be enhanced may be positioned to contact each other, and an electrode layer may not be positioned between the two emission layers.

The stack structure of the emission layer of the above method, changes the characteristics of the white light generated from the emission layer. For example, compared with the stack structure including one red emission layer, the stack structure according to the present exemplary embodiment may output the white light in which that the wavelength region of the red light is widened or the luminance intensity is increased. In an aspect to the color temperature, the white light of the general stack structure, for example, has a color temperature of about 6500 K, however the structure according to the present exemplary embodiment may have a color temperature of about 2000 to about 4000 K, for example. Since the white light enhanced with the red light is output in the stack structure, although the input image signal is processed and displayed by the general method, the image enhanced with the red is displayed. Accordingly, the color may be further correctly divided or sensed when the red-color vision defectives see the image displayed by the display device. In contrast, the normal person sees the image in which the entire color is distorted or the red is exaggerated. If the image is displayed by reducing the luminance of the red pixel corresponding to the red filter 230R or increasing the luminance of the green pixel and the blue pixel respectively corresponding to the green filter 230G and the blue filter 230B, the normal person may see the normal image without the color distortion or exaggeration.

In the above, the stack structure of the emission layer to enhance the red was described. This stack structure may be applied with the same method when enhancing the green or the blue. For example, when enhancing the green for the green-color vision defectives, the blue emission layer 361 and the red emission layer 363 are respectively formed as one layer, and the green emission layer 362 is formed of two emission layers that have the same spectrum or the different spectrums.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display device, comprising:
a display panel including a plurality of unit pixels; and
a signal controller that is configured to control the display panel by processing an input image signal,
wherein:
each of the plurality of unit pixel has only three color pixels that display a first color, a second color, and a third color,
the first color, the second color, and the third color are sequentially displayed by a time division,
in a color weakness mode, the first color is displayed with a higher intensity than the input image signal, and the second color and the third color are displayed with the same intensity as the input image signal, and
in the color weakness mode, during one frame, the pixel displaying the first color is displayed longer than the pixels displaying the second and third colors.

2. The display device of claim 1, wherein
the color weakness mode includes a plurality of lower modes, and
the lower modes include:
a protanomaly mode emphasizing red;
a deuteranomaly mode emphasizing green; and
a tritanomaly mode emphasizing blue.

3. The display device of claim 1, wherein
in a normal mode, the first color, the second color and the third colors are displayed with the same intensity as the input image signal.

4. The display device of claim 3, further comprising:
a mode selector to select the normal mode or the color weakness mode.

5. The display device of claim 1, wherein
the signal controller includes an image convertor converting the input image signal to generate a compensation image signal.

6. The display device of claim 5, wherein
the image convertor generates the compensation image signal by increasing a gray level of a predetermined color so as to increase luminance of the predetermined color related to the color weakness.

7. The display device of claim 5, wherein
the compensation image signal is stored to a storage unit as an image conversion setting value.

8. The display device of claim 5, wherein
the signal controller further includes:
an image input section receiving the input image signal; and
an image processor generating image data based on the input image signal or the compensation image signal.

9. The display device of claim 8, wherein
in the normal mode, the image processor receives the input image signal from the image input section to generate the image data, and
in the color weakness mode, the image processor receives the compensation image signal from the image convertor to generate the image data.

10. The display device of claim 1, wherein
in the color weakness mode, during one frame, the pixels displaying the second and third colors are applied with higher data voltages than the data voltages corresponding to the input image signals.

11. The display device of claim 1, wherein
in the color weakness mode, during one frame, the pixel displaying the first color is applied with a high data voltage than the data voltage corresponding to the input image signal.

12. The display device of claim 1, wherein
the display device includes a light-emitting element as an organic light emitting diode.

\* \* \* \* \*